US009325127B2

(12) United States Patent
Ku et al.

(10) Patent No.: US 9,325,127 B2
(45) Date of Patent: Apr. 26, 2016

(54) PATCH PANEL STRUCTURE

(71) Applicant: YFC-BONEAGLE Electric Co., Ltd., Taoyuan County (TW)

(72) Inventors: Ying-Ming Ku, Taoyuan County (TW); Wen-Fu Pon, Taoyuan County (TW); Chun-Chieh Chen, Taoyuan County (TW)

(73) Assignee: YFC-BONEAGLE ELECTRIC CO., LTD., Taoyuan County (TW)

( * ) Notice: Subject to any disclaimer, the term of this patent is extended or adjusted under 35 U.S.C. 154(b) by 0 days.

(21) Appl. No.: 14/475,307

(22) Filed: Sep. 2, 2014

(65) Prior Publication Data

US 2016/0064878 A1 Mar. 3, 2016

(51) Int. Cl.
*H05K 1/00* (2006.01)
*H01R 24/64* (2011.01)
*H01R 12/71* (2011.01)

(52) U.S. Cl.
CPC .............. *H01R 24/64* (2013.01); *H01R 12/716* (2013.01)

(58) Field of Classification Search
CPC .... H01R 24/64; H01R 12/716; H01R 23/725; H01R 9/091; H01R 12/585; H01R 23/7073
USPC ..................... 439/78, 60, 61, 65, 83; 361/788
See application file for complete search history.

(56) References Cited

U.S. PATENT DOCUMENTS

| | | | | | |
|---|---|---|---|---|---|
| 5,459,643 | A * | 10/1995 | Siemon | H01R 13/6466 | 361/746 |
| 6,504,726 | B1 * | 1/2003 | Grabinger | H05K 1/0228 | 361/796 |
| 7,057,899 | B2 * | 6/2006 | AbuGhazaleh | H05K 1/0228 | 361/780 |
| 7,371,109 | B2 * | 5/2008 | Verding | H04Q 1/13 | 439/532 |
| 7,733,667 | B2 * | 6/2010 | Qin | H05K 7/142 | 174/138 E |
| 8,061,534 | B2 * | 11/2011 | Laursen | H04Q 1/09 | 211/26 |
| 2005/0221660 | A1 * | 10/2005 | Coffey | H04Q 1/146 | 439/404 |
| 2007/0163801 | A1 * | 7/2007 | Coffey | H04Q 1/146 | 174/250 |
| 2009/0004894 | A1 * | 1/2009 | Jiang | H01R 13/74 | 439/78 |
| 2010/0151707 | A1 * | 6/2010 | AbuGhazaleh | H01R 13/6272 | 439/76.1 |
| 2010/0151710 | A1 * | 6/2010 | AbuGhazaleh | H01R 13/6466 | 439/78 |
| 2013/0187460 | A1 * | 7/2013 | Nordin | G02B 6/4452 | 307/35 |
| 2015/0024614 | A1 * | 1/2015 | Gao | H01R 13/514 | 439/78 |
| 2015/0056825 | A1 * | 2/2015 | Hsu | H01R 13/6587 | 439/78 |
| 2015/0056826 | A1 * | 2/2015 | Gao | H01R 13/6633 | 439/78 |
| 2015/0056827 | A1 * | 2/2015 | Gao | H01R 13/6587 | 439/78 |

* cited by examiner

*Primary Examiner* — Tulsidas C Patel
*Assistant Examiner* — Peter G Leigh
(74) *Attorney, Agent, or Firm* — Chun-Ming Shih; HDLS IPR Services

(57) ABSTRACT

A patch panel structure includes a circuit board, a plurality of first RJ45 sockets, and a plurality of second RJ45 sockets. The circuit board has a first end and a second end opposite to each other. A plurality of first conducting points are formed at the first end. A plurality of second conducting points are formed at the second end. Each of the first RJ45 sockets forms a first interface and is electrically connected to each of the first conducting points. Each of the second RJ45 sockets forms a second interface, is electrically connected to each of the second conducting points, and is disposed in a parallel and symmetrical manner with respect to each of the first RJ45 sockets. Each of the first interfaces of the first RJ45 sockets is disposed in a back-to-back and spaced-apart manner with respect to each of the second RJ45 sockets.

4 Claims, 6 Drawing Sheets

PATCH PANEL STRUCTURE

BACKGROUND

1. Technical Field

The present invention relates to a patch panel structure and, in particular, to a patch panel structure having RJ45 sockets at its two ends for insertion of corresponding RJ45 plugs.

2. Related Art

Cables/lines of a local area network (LAN) are utilized to connect equipments such as a personal computer, a printer, and a facsimile machine. High speed digital signals are used to transmit data between these equipments. Such high performance digital signals are usually transmitted by using a plug-in type connector (ex: RJ11, RJ45, or coaxial plug-in type connector) connected to a printed circuit board. Since there are many computers, servers, printers, and facsimile machines in an office, the cables/lines of the LAN connect all these equipments to a telecom/electrical distribution box.

The connector used in the high speed network is RJ45 (including an RJ45 plug and an RJ45 socket). A commonly used RJ45 connector is a 8P8C connector, wherein 8P indicates 8 positions, and 8C indicates 8 contacts (e.g. gold plated contacts). However, in practical application, only two pairs of lines are in use, the other two pairs of lines can be provided for use by telephone line and equipments such as the facsimile machine. A standard RJ45 cable is 8 pins, which is different from the wiring of the networking distribution box/rack assigned from the telecom distribution box in the server room, and therefore connection/wiring sometimes needs to be made by a patch panel.

According to conventional techniques, one end of the patch panel needs a puncture type terminal to make connection with an insulation displacement contact (IDC), and the other end of the patch panel connects the commonly used RJ45 socket. To connect the IDC, professional tools are required in the punch-down connection process to connect the IDC socket. To meet different demands or make cables/lines connect another connection port, another punch-down connection process is required to make connection, which is complicated and time-consuming.

In view of the foregoing, the inventor made various studies to improve the above-mentioned problems to realize the improvements by inventing the present invention.

BRIEF SUMMARY

It is an object of the present invention to provide a patch panel structure, by which the time of using a puncture-type terminal to punch down is reduced, thereby making the assembly more convenient and faster.

Accordingly, the present invention provides a patch panel structure, for connecting a plurality of network plugs and a plurality of telecommunication plugs. The patch panel structure comprises a circuit board, a plurality of first RJ45 sockets, and a plurality of second RJ45 sockets. The circuit board has a first end and a second end opposite to each other. A plurality of first conducting points are formed at the first end. A plurality of second conducting points are formed at the second end. Each of the first RJ45 sockets forms a first interface and is electrically connected to each of the first conducting points. Each of the first RJ45 sockets is provided for insertion of each of the network plugs. Each of the second RJ45 sockets forms a second interface and is electrically connected to each of the second conducting points. Each of the second RJ45 sockets is disposed in a parallel and symmetrical manner with respect to each of the first RJ45 sockets.

Each of the second RJ45 sockets is provided for insertion of each of the telecommunication plugs. Each of the first interfaces of the first RJ45 sockets is disposed in a back-to-back and spaced-apart manner with respect to each of the second interfaces of the second RJ45 sockets.

Preferably, the present invention further comprises a first housing and a second housing. The first housing and the second housing respectively cover each of the first RJ45 sockets, each of the second RJ45 sockets, and the circuit board.

It is preferable that the circuit board comprises a plurality of first positioning holes, the second housing comprises a plurality of first positioning pillars, and each of the first positioning pillars is disposed corresponding to each of the first positioning holes. The first housing further comprises a plurality of second positioning holes, the second housing further comprises a plurality of second positioning pillars, and each of the second positioning pillars is disposed corresponding to each of the second positioning holes. A plurality of positioning elements respectively secure each of the first positioning pillars by passing through the circuit board from each of the first positioning holes. Alternatively, the aforesaid positioning elements respectively secure each of the second positioning pillars through each of the second positioning holes.

The present invention also has the following features. The conventional panel originally having the IDC at its one end to connect the RJ45 socket is improved to become a patch panel structure having the RJ45 sockets at both ends, so as to satisfy customers' demands and facilitate wiring re-arrangement/adjustment among RJ45 sockets. The patch panel structure is assembled to the second housing (lower cover) by screws, and then the first housing (upper cover) is fixed to the second housing by screws to complete the assembly of the patch panel structure.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
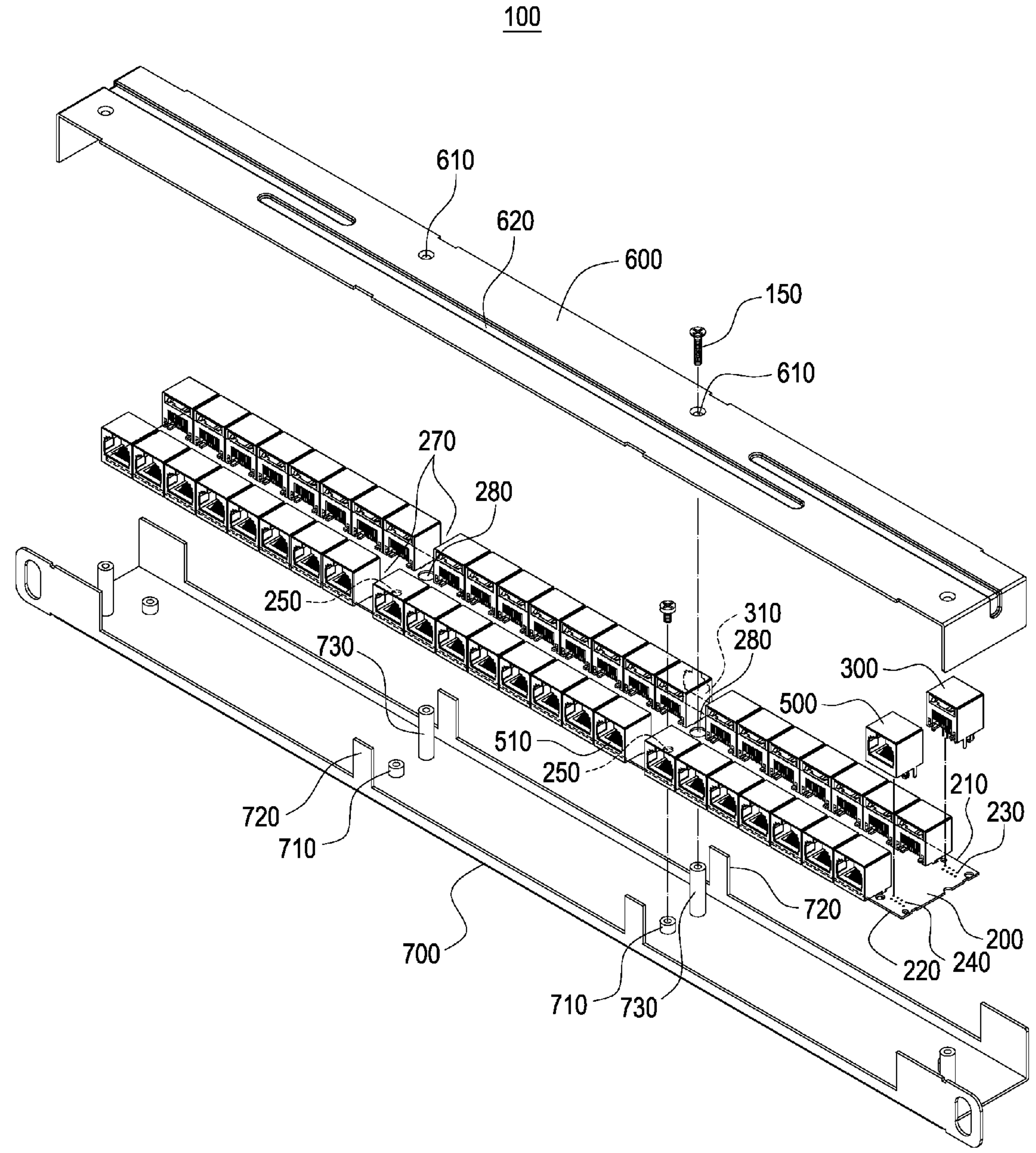
FIG. 1 is a partially exploded view of a patch panel structure according to the present invention.
Figure 2:
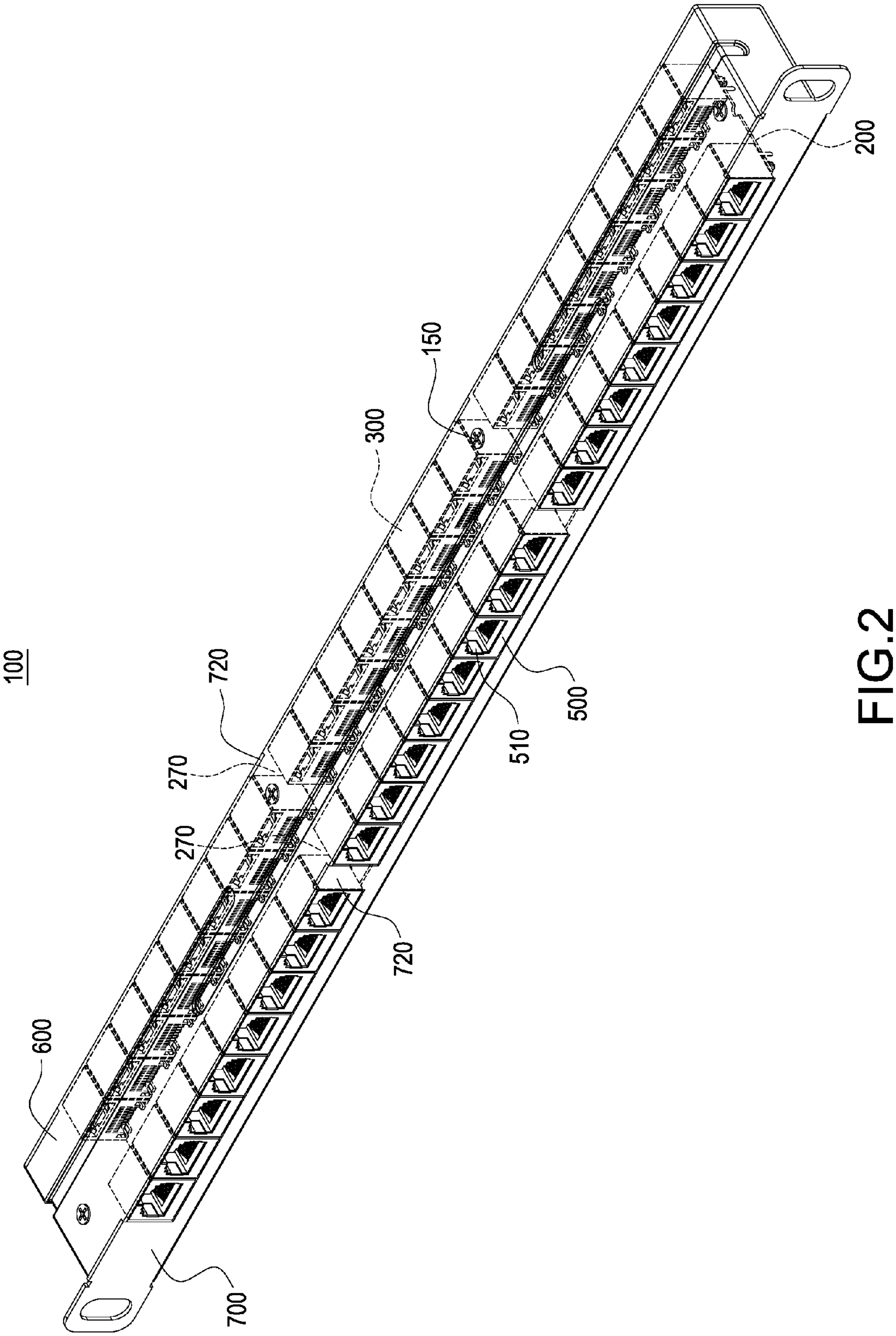
FIG. 2 is a schematic perspective view illustrating an assembled state of FIG. 1.
Figure 3:
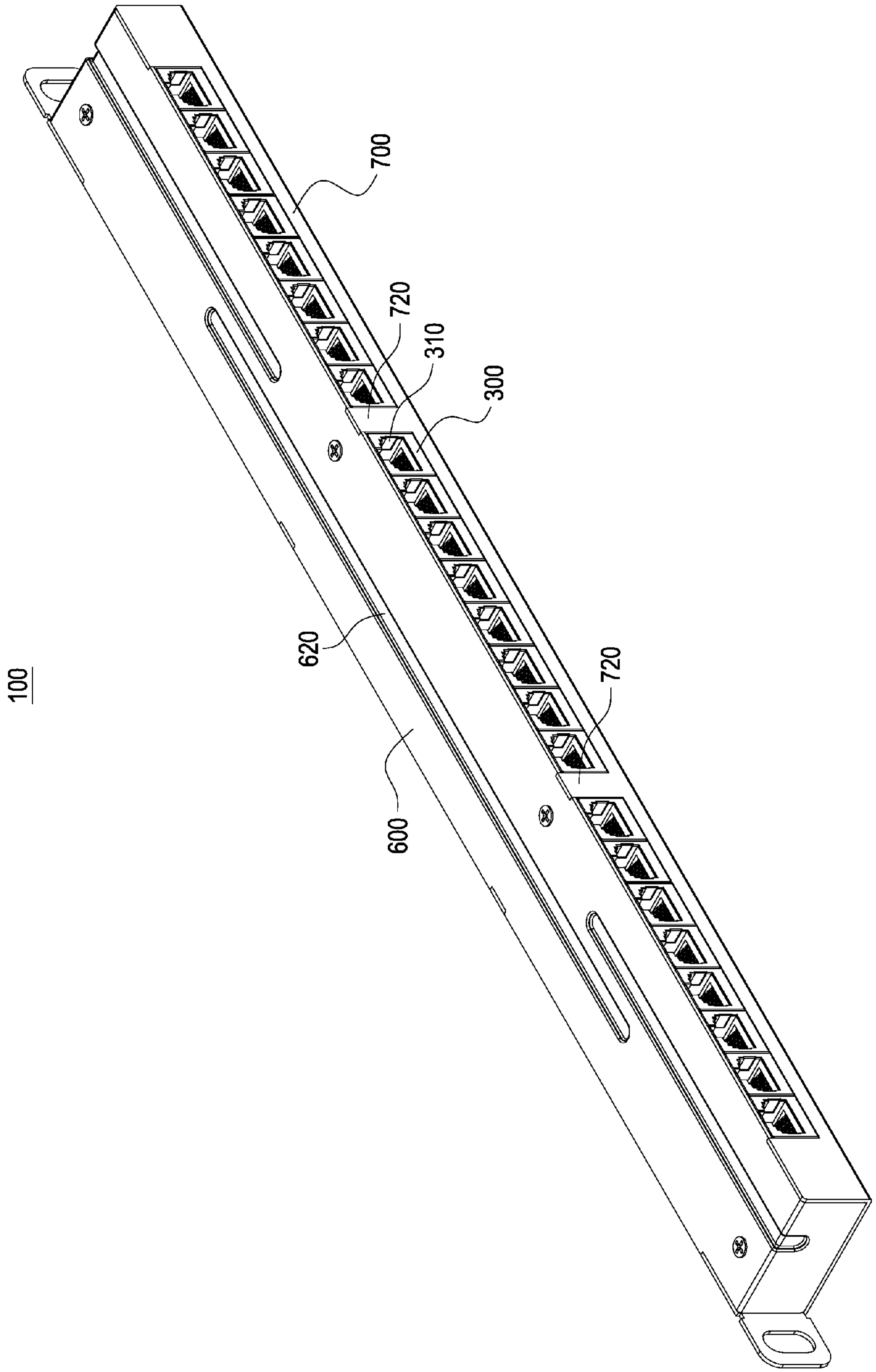
FIG. 3 is a schematic perspective view, from another viewing angle, illustrating the assembled state of FIG. 1.

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

Referring to FIGS. 1 to 6, the present invention provides a patch panel structure 100 which has two ends connecting to a plurality of network plugs 800 and a plurality of telecommunication plugs 900 respectively. Preferably, the network plugs 800 and the telecommunication plugs 900 mentioned above are RJ45 plugs. The patch panel structure 100 of the present invention is preferably installed in a rack mountable server in a server room. In another preferable embodiment, the patch panel structure 100 can also be disposed in a telecommunication facility having a specific size or be installed in a standardized telecommunication rack.

Referring to FIGS. 1 to 4, the patch panel structure 100 comprises a circuit board 200, a plurality of first RJ45 sockets 300, and a plurality of second RJ45 sockets 500. The circuit board 200 has a first end 210 and a second end 220 opposite to each other. A plurality of first conducting points 230 are formed at the first end 210, a plurality of second conducting points 240 are formed at the second end 220. Each of the first RJ45 sockets 300 is disposed in a parallel and symmetrical manner, on one surface of the circuit board 200, with respect to each of the second RJ45 sockets 500. However, in other embodiments, each of the first RJ45 sockets 300 can be disposed non-symmetrically, on the surface of the circuit board 200, with respect to each of the second RJ45 sockets 500.

Figure 4:
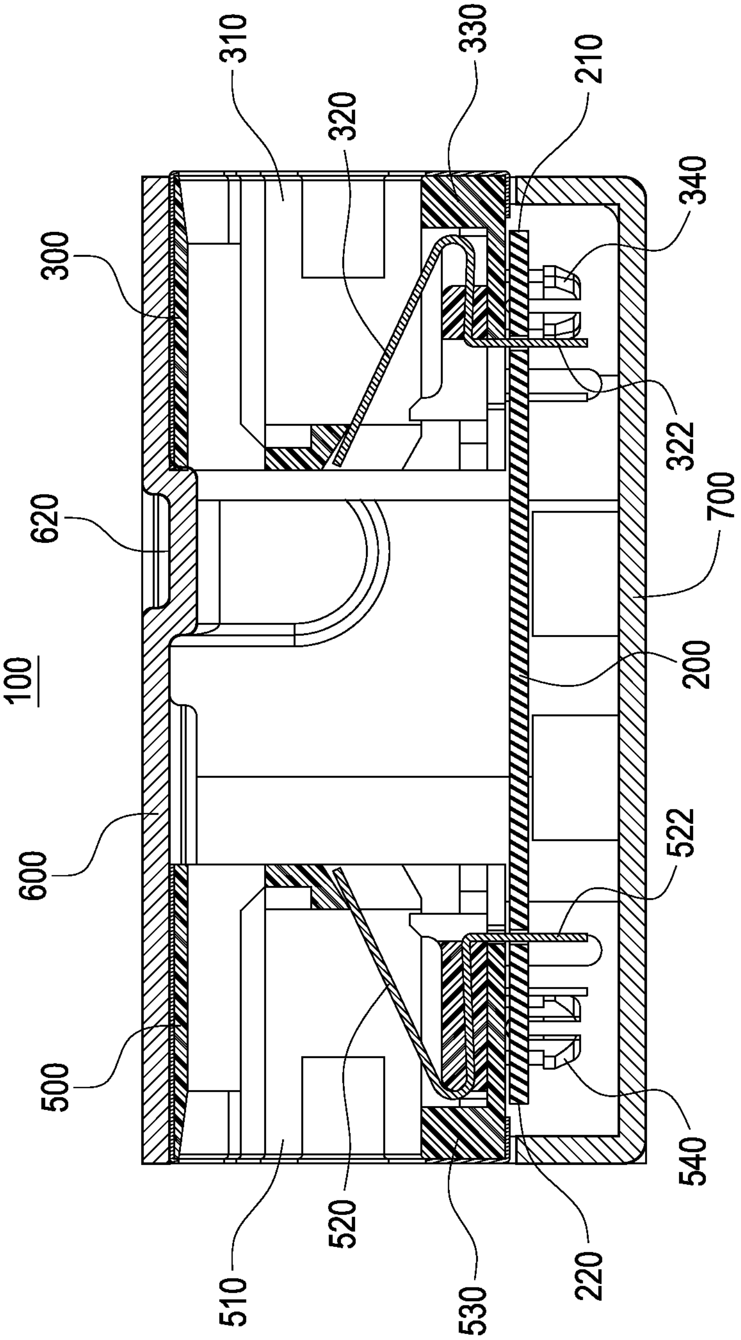
FIG. 4 is a cross-sectional view of an internal structure of each two corresponding RJ45 sockets according to the present invention.

Each of the first RJ45 sockets 300 forms a first interface 310 and is electrically connected to each of the first conducting points 230. Each of the first RJ45 sockets 300 is provided for insertion of each of the network plugs 800. Each of the second RJ45 sockets 500 forms a second interface 510 and is electrically connected to each of the second conducting points 240. Each of the second RJ45 sockets 500 is disposed in a parallel and symmetrical manner with respect to each of the first RJ45 sockets 300, and is provided for insertion of each of the telecommunication plugs 900. Each of the first interfaces 310 of the first RJ45 sockets 300 is disposed in a back-to-back and spaced-apart manner with respect to each of the second interfaces 510 of the second RJ45 sockets 500. Referring to FIG. 4, each of the first RJ45 sockets 300 and each of the second RJ45 sockets 500 respectively include a plurality of conductive terminals 320, 520. Each of the conductive terminals 320 further includes a welding portion 322, 522. Each welding portion 322, 522 is welded to each corresponding first conducting point 230 or each corresponding second conducting point 240.

According to the embodiment shown in FIGS. 1 to 4, a welding portion 322 of each first RJ45 socket 300 and a welding portion 522 of each second RJ45 socket 500 are welded to the circuit board 200 by using a dual in-line package (DIP) method. However, in different embodiments, the welding portion 322 of each first RJ45 socket 300 and a welding portion 522 of each second RJ45 socket 500 can be welded to the circuit board 200 by using a surface mounted technology (SMT). Referring to FIG. 4, each first RJ45 socket 300 and each second RJ45 socket 500 further include an insulation 330,530 and an insulating pillar 340,540. Each of the first interfaces 310 of the first RJ45 sockets 300 is disposed toward outside the first end 210. Each of the second interfaces 510 of the second RJ45 sockets 500 is disposed toward outside the second end 220. Each insulating pillar 340,540 is disposed on a bottom of the insulation 330, 530 so as to be positioned to the circuit board 200.

The present embodiment further includes a first housing 600 and a second housing 700. The first housing 600 and the second housing 700 preferably consist of iron or alloy of iron. The first housing 600 and the second housing 700 respectively covers each first RJ45 socket 300, each second RJ45 socket 500 and the circuit board 200. The first interface 310 is disposed toward the first end 210 of the circuit board 200. The second interface 510 is disposed toward the second end 220 of the circuit board 200. The circuit board 200 includes a plurality of first positioning holes 250, a plurality of through holes 280, and a plurality of intervals 270. An area where each of the first positioning holes 250 and each of the through holes 280 are formed on the circuit board 200 defines each interval 270 between each two adjacent first or second RJ45 sockets. In brief, each of the intervals 270 is provided to allow assembly of the first housing 600, the second housing 700, and the patch panel structure 100.

The second housing 700 comprises a plurality of first positioning pillars 710 and a plurality of second positioning pillars 730. Each of the first positioning pillars 710 contacts each of the first positioning holes 250 (i.e., contacting a bottom surface of the circuit board 200), and each of the second positioning pillars 730 passes through each of the through holes 280 to contact the first housing 600. Preferably, the embodiment uses a plurality of positioning elements 150, such as screws, to secure the first housing 600 and the second housing 700. More specifically, each of the positioning elements 150 secures each of the first positioning pillars 710 by passing through the circuit board 200 from each of the first positioning holes 250. In other embodiments, each of the positioning pillars 710 can also pass through the circuit board 200 and be secured thereto.

Figure 5:
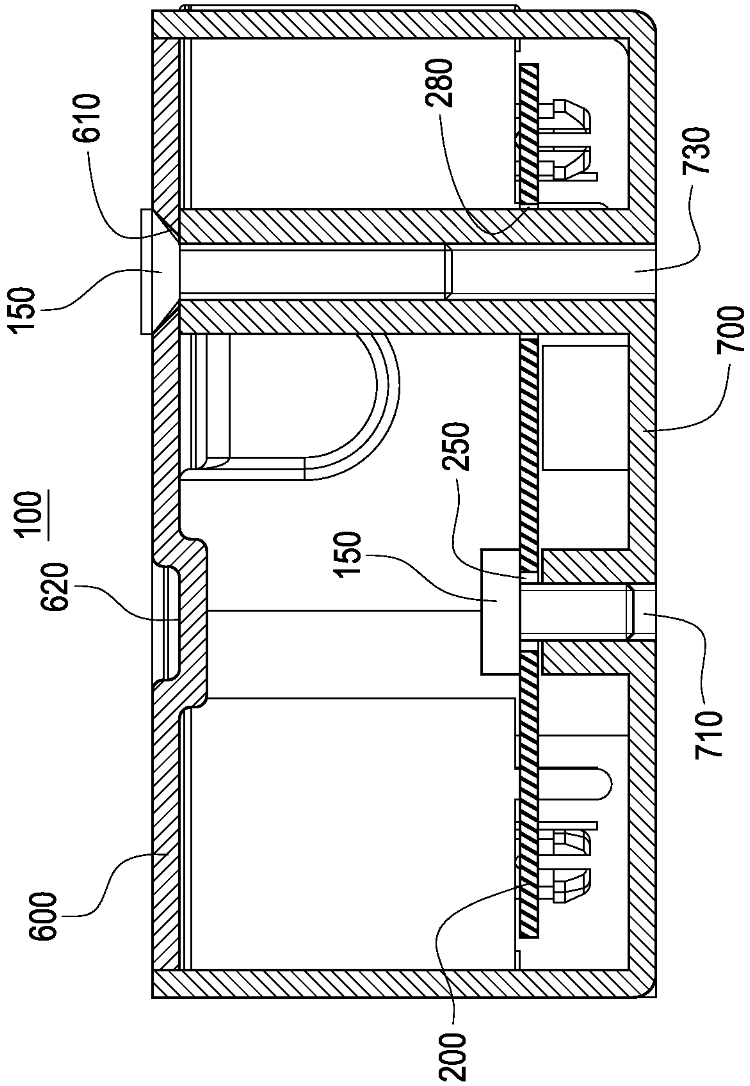
FIG. 5 is a cross-sectional view illustrating that positioning elements are positioned at a first positioning pillar and a second positioning pillar according to the present invention.

Referring to FIG. 5, the first housing 600 further comprises a plurality of second positioning holes 610. Each of the second positioning pillars 730 contacts each of the second positioning holes 610 (i.e., contacting a bottom surface of the first housing 600). Each of the positioning elements 150 passes through each of the second positioning holes 610 to secure each of the second positioning pillars. In another embodiment, the second positioning pillar 730 can also pass through the through hole 280 of the circuit board 200 and directly be secured to the first housing 600.

The first housing 600 further includes at least one trench 620 for increasing the strength of the first housing 600. In other preferable embodiments, the trench 620 can also be formed on the second housing 700. The number of the trenches 620 is not limited herein. Furthermore, the first housing 600 or the second housing 700 further includes a plurality of block plates 720. In the embodiment shown in FIGS. 1 to 3, it is preferable that each of the block plates 720 is perpendicularly connected to two long sides of the second housing 700. However, in other embodiments, each of the block plates 720 can also be disposed at two long sides of the first housing 600 and protrude toward the second housing 700.

Referring to FIG. 1, each block plate 720 is used to cover each interval 270 formed on the circuit board 200. Each block plate 270 is preferably engaged between each two adjacent first RJ45 sockets 300 or each two adjacent second RJ45 sockets 500. In the present embodiment, each block plate 720, each first positioning pillar 710, and each second positioning pillar 730 are corresponding and parallel to one another in a way such that the first RJ45 sockets 300 and the second RJ45 sockets 500 are respectively in a maximum possible number and arranged in order. Certainly, in different embodiments, each block plate 720, each first positioning pillar 710, and each second positioning pillar 730 can be arranged, as required, in a non-corresponding manner on the second housing 700.

The assembly procedures are as follows. Each first RJ45 socket 300 is disposed corresponding to each first conducting point 230. Each second RJ45 socket 500 is correspondingly welded to each second conducting point 240. Then, the positioning element 150 is used to secure the second housing 700. After the patch panel structure 100 utilizes the circuit board 200 to be secured to the second housing 700, the first housing 600 is secured to the second housing 700 by the abovementioned positioning element 150, so as to complete the assembly of the patch panel structure 100 of the present invention.

Figure 6:
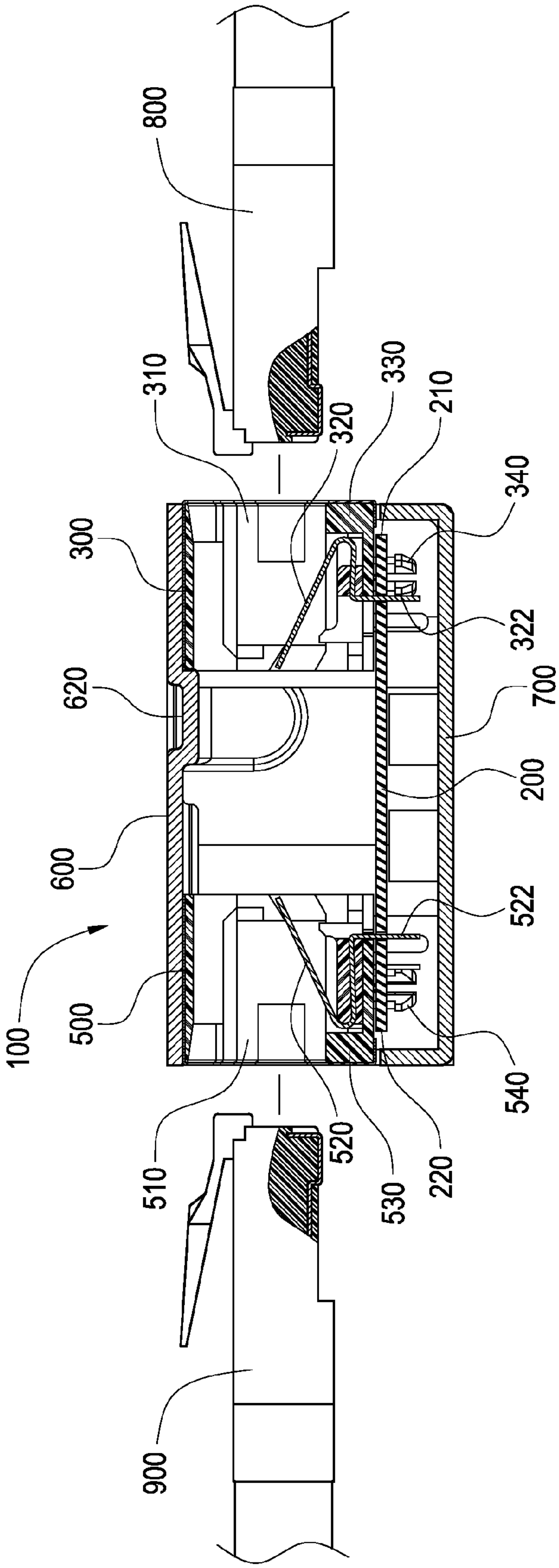
FIG. 6 is a cross-sectional view illustrating that the patch panel structure is inserted by each two corresponding RJ45 plugs.

Referring to FIG. 6, each first RJ45 socket 300 is inserted by each network plug 800. Each second RJ45 socket 500 is inserted by each telecommunication plug 900. It is preferable that both the network plug 800 and the telecommunication plug 900 are RJ45 sockets. Related structures of the RJ45 plug and the RJ45 socket of the patch panel structure belong to conventional technologies, and thus repetitive descriptions are omitted herein.

In conclusion, the above described embodiments are not to limit the present invention unless otherwise specified, but rather should be construed broadly within the spirit and scope of the invention as defined in the appended claims. The described embodiments are to be considered in all respects as illustrative only and not restrictive. Various modifications and equivalent arrangements/structures are intended to be included within the spirit and scope of the invention and appended claims.

What is claimed is:

1. A patch panel structure for connecting a plurality of network plugs and a plurality of telecommunication plugs respectively, comprising:

- a circuit board having a first end and a second end opposite to each other, a plurality of first conducting points being formed at the first end, a plurality of second conducting points being formed at the second end, wherein the circuit board comprises a plurality of first positioning holes, a plurality of through holes, and a plurality of intervals, each of the first positioning holes and each of the through holes are formed on an area where each interval is defined;
- a plurality of first RJ45 sockets, each of the first RJ45 sockets forming a first interface and electrically connected to each of the first conducting points, each of the first RJ45 sockets being provided for insertion of each of the network plugs;
- a plurality of second RJ45 sockets, each of the second RJ45 sockets forming a second interface and electrically connected to each of the second conducting points, each of the second RJ45 sockets being disposed in a parallel and symmetrical manner with respect to each of the first RJ45 sockets, each of the second RJ45 sockets being provided for insertion of each of the telecommunication plugs, wherein each of the first interfaces of the first RJ45 sockets is disposed in a back-to-back and spaced-apart manner with respect to each of the second interfaces of the second RJ45 sockets;
- a first housing and a second housing, the first housing and the second housing respectively covering each of the first RJ45 sockets, each of the second RJ45 sockets, and the circuit board, wherein a plurality of second positioning holes are formed on the first housing, a plurality of first positioning pillars and a plurality of second positioning pillars protrude from an inner surface of the second housing, each of the first positioning pillars corresponds and abuts to each of the first positioning holes, and each of the second positioning pillars passing through each of the through holes corresponds and abuts to each of the second positioning holes;
- a plurality of first positioning elements, each of the positioning elements securing each of the first positioning pillars by passing through the circuit board from each of the first positioning holes so as to fix the circuit board on the second housing; and
- a plurality of second positioning elements, each of the positioning elements securing each of the second positioning pillars by passing through the first housing from each of the second positioning holes so as to fix the first housing with the second housing.

2. The patch panel structure of claim 1, wherein the first housing further includes at least one trench for increasing the strength of the first housing.

3. The patch panel structure of claim 1, wherein the first housing or the second housing further includes a plurality of block plates corresponding to the plurality of intervals, respectively, and each of the block plates is perpendicularly connected to the first housing or the second housing and protrudes toward the second housing or the first housing.

4. The patch panel structure of claim 3, wherein each of the block plates, each of the first positioning pillars, and each of the second positioning pillars are arranged corresponding and parallel to one another, and each of the block plates is engaged between each adjacent two first RJ45 sockets or between each adjacent two second RJ45 sockets.

* * * * *